United States Patent
Vanderzon

(10) Patent No.: US 10,028,347 B2
(45) Date of Patent: Jul. 17, 2018

(54) ZERO-CROSSING DETECTION CIRCUIT FOR A DIMMER CIRCUIT

(71) Applicant: Ozuno Holdings Limited, Tortola (VG)

(72) Inventor: James Vanderzon, MacDonald Park (AU)

(73) Assignee: Ozuno Holdings Limited, Tortola (VG)

( * ) Notice: Subject to any disclaimer, the term of this patent is extended or adjusted under 35 U.S.C. 154(b) by 0 days.

(21) Appl. No.: 15/313,077

(22) PCT Filed: May 20, 2015

(86) PCT No.: PCT/AU2015/000299
§ 371 (c)(1),
(2) Date: Nov. 21, 2016

(87) PCT Pub. No.: WO2015/176112
PCT Pub. Date: Nov. 26, 2015

(65) Prior Publication Data
US 2017/0150566 A1 May 25, 2017

(30) Foreign Application Priority Data
May 22, 2014 (AU) ................................ 2014901926

(51) Int. Cl.
*H05B 33/08* (2006.01)
(52) U.S. Cl.
CPC ..... *H05B 33/0845* (2013.01); *H05B 33/0815* (2013.01)
(58) Field of Classification Search
CPC ....... G01R 19/175; G01R 19/14; H02M 1/32; H02M 1/44; H02M 3/33546;
(Continued)

(56) References Cited

U.S. PATENT DOCUMENTS

| 5,926,062 A * | 7/1999 | Kuroda | G05F 3/265 323/315 |
| 7,339,331 B2 | 3/2008 | Vanderzon | |

(Continued)

FOREIGN PATENT DOCUMENTS

WO  WO 2015/176112  11/2015

OTHER PUBLICATIONS

International Search Report and Written Opinion of International Patent Application No. PCT/AU2015/000299, filed May 20, 2015. Received Jun. 11, 2015. 16 pages.

*Primary Examiner* — Alexander H Taningco
*Assistant Examiner* — Renan Luque
(74) *Attorney, Agent, or Firm* — The Webb Law Firm

(57) ABSTRACT

A zero-crossing detection circuit for a trailing edge phase control dimmer circuit for controlling alternating current (AC) power to a load, wherein the circuit includes: a switching circuit for controlling delivery of AC power to the load by conducting power to the load in an ON state and not conducting power to the load in an OFF state; a switching control circuit for controlling turn-OFF and turn-ON of the switching circuit at each cycle of the AC; and a rectifier for rectifying the AC power in the non-conduction period to generate rectified dimmer voltage to be provided to the dimmer circuit, wherein the zero-crossing detection circuit includes a current sink circuit; wherein the current sink circuit has a low impedance at low instantaneous AC voltages; a comparator circuit configured to detect zero crossings of a first threshold value of the rectified dimmer voltage.

11 Claims, 2 Drawing Sheets

(58) Field of Classification Search
CPC .... H02M 2001/0006; H02M 2001/322; H03K 5/1536
See application file for complete search history.

(56) References Cited

U.S. PATENT DOCUMENTS

| | | | |
|---|---|---|---|
| 2003/0197995 A1* | 10/2003 | Hua | H02M 5/293 361/100 |
| 2008/0157820 A1* | 7/2008 | Hastings | G01R 19/16576 327/78 |
| 2009/0167265 A1* | 7/2009 | Vanderzon | H03K 17/133 323/271 |
| 2012/0033471 A1* | 2/2012 | Newman, Jr. | H05B 33/0815 363/126 |
| 2013/0002163 A1 | 1/2013 | He et al. | |
| 2013/0113391 A1 | 5/2013 | Mercier et al. | |
| 2014/0028209 A1* | 1/2014 | Kitamura | H05B 33/0806 315/200 R |
| 2014/0077721 A1 | 3/2014 | Melanson et al. | |
| 2014/0285099 A1* | 9/2014 | Akahoshi | H05B 33/0815 315/200 R |

\* cited by examiner

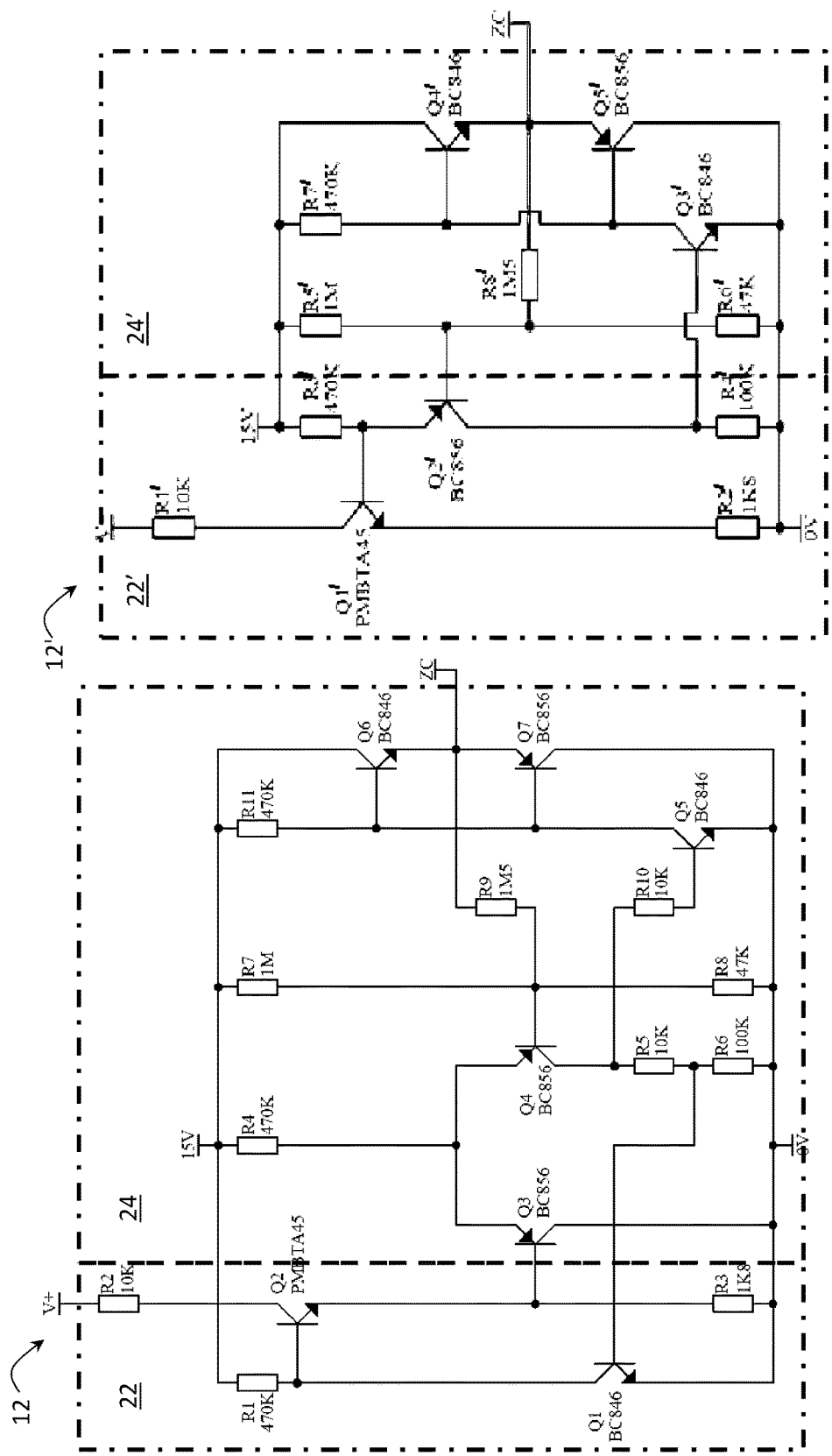

ZERO-CROSSING DETECTION CIRCUIT FOR A DIMMER CIRCUIT

This application is a U.S. National Stage of International Application No. PCT/AU2015/000299, filed May 20, 2015, which claims benefit of Australia Application No. 2014901926, filed on May 22, 2014, which are incorporated by reference herein.

TECHNICAL FIELD

The present invention relates to a zero-crossing detection circuit for a trailing edge phase control dimmer circuit.

In particular, but not exclusively, the present invention relates to a zero-crossing detection circuit for a trailing edge phase control dimmer circuit for controlling a capacitive load, such as a driver for LED lights.

BACKGROUND OF INVENTION

Dimmer circuits are commonly used to control power, in particular alternating current (AC) mains power, to a load, such as a light source. In one existing method, a light source can be dimmed using phase controlled dimming whereby power provided to the load is controlled by varying the amount of time that a switch connecting the load to a mains power source is conducting during a cycle of the AC (i.e. varying the duty time). Specifically, AC power to the load is switched ON and OFF during each half cycle of alternating current and the amount of dimming of the load is provided by the amount of ON time in relation to the OFF time for each half cycle.

Phase control dimmer circuits generally operate as trailing edge or leading edge dimmer circuits, and the two circuits are suited to different applications. In leading edge circuits, power is switched OFF at the beginning of each half cycle. In trailing edge circuits, power is switched OFF later in each half cycle (e.g. towards the end of each half cycle). Leading edge dimmer circuits are generally better suited to controlling power to inductive loads, such as small fan motors and iron core low voltage lighting transformers. Trailing edge dimmer circuits, on the other hand, are generally better suited to controlling power to capacitive loads, such as drivers for Light Emitting Diode (LED) lights.

Phase control dimmer circuits, however, can produce line conducted harmonics causing electromagnetic interference (EMI) emissions when switching ON and OFF power to the load—particularly, for instance, switching ON and OFF power to complex loads such as compact fluorescent lighting (CFL) and LED light drivers. More specifically, these dimmer circuits include a switching circuit and a switching control circuit for controlling delivery of AC power to the load by conducting power to the load in an ON state (conduction period) and not conducting power to the load in an OFF state (non-conduction period). During the OFF state of each half cycle of AC, power is available to the dimmer circuit for operation thereof.

In some exemplary prior art dimmer circuits, the switching control circuit includes a zero-crossing detection circuit configured to detect a zero crossing of the AC to define the conduction periods and non-conduction periods in an ideal dimmer circuit. In practice, however, many exemplary existing dimmer circuits (e.g. 2-wire trailing edge phase control dimmer circuits) exhibit half-cycle conduction period commencement several tenths of a millisecond prior to true zero-crossing; hence, step-voltage is applied to the load which can cause current pulses and EMI emissions especially with capacitive electronic load types such as LED or CFL light drivers.

The AC (line) power provided to the dimmer circuit in the non-conduction period is first rectified by a rectifier. The rectified dimmer voltage (e.g. rectified via full-wave rectifier) is of a pulse form normally having repetition rate equal to twice the line frequency. The rectification, however, produces parasitic capacitance and a relatively high zero-crossing voltage is necessary to mitigate filtering effects of the parasitic capacitance.

Thus, with some capacitive-input and low power-factor load types, the effect of a non-zero zero-crossing voltage threshold can cause a significant advancement of the conduction period commencement, especially when the exemplary dimmer circuit is operating at higher operating conduction angles. In these cases, the result for these load types can be a noticeable reduction in achievable brightness at a maximum dimmer setting, and/or the onset of asymmetry of non-conduction periods which can cause an undesirable effect of flickering of an LED light driven by the load. Both these effects are due to a reduced magnitude of dimmer voltage, in some cases resulting from the load type topology, in comparison to the corresponding line voltage caused by the advanced zero-crossing.

As described, one of the major causes of inaccurate zero-crossing detection can be attributed to the effects of component parasitic capacitance associated with the rectified dimmer voltage. Such capacitance acts to partially smooth the rectified dimmer voltage and causes some lagging phase-shift of the zero-crossing where the voltage minimums do not reach zero. Thus, in order to minimise these filtering effects, an exemplary prior art trailing edge phase control dimmer circuit requires lower (dissipative) impedance. This lower impedance, however, causes higher dimmer losses and thus is not a satisfactory solution to minimising the detrimental filtering effects.

SUMMARY OF INVENTION

Accordingly, in one aspect of the present invention, there is provided a zero-crossing detection circuit for a trailing edge phase control dimmer circuit for controlling alternating current (AC) power to a load, wherein the trailing edge phase control dimmer circuit includes: a switching circuit for controlling delivery of AC power to the load by conducting power to the load in an ON state and not conducting power to the load in an OFF state, wherein the ON state is a conduction period and the OFF state is a non-conduction period; a switching control circuit for controlling turn-OFF and turn-ON of the switching circuit at each cycle of the AC to control switching of the ON and OFF states of the switching circuit; and a rectifier for rectifying the AC power in the non-conduction period to generate rectified dimmer voltage to be provided to the dimmer circuit, wherein the zero-crossing detection circuit includes: a current sink circuit including a series resistor connected to a collector of a current-limiting transistor and an emitter resistor connected to an emitter of the current-limiting transistor, wherein the current sink circuit has a low impedance at low instantaneous AC voltages to reduce effects of filtering by parasitic capacitance associated with the rectifier; and a comparator circuit configured to detect zero crossings of a first threshold value of the rectified dimmer voltage across the series resistor and the emitter resistor, wherein the comparator circuit is further configured to initiate the switching circuit to operate and commence one of the conduction periods when the rectified dimmer voltage crosses below the first threshold value.

The zero-crossing detection circuit provides low impedance at low instantaneous AC (line) voltages via the current sink circuit. It will be appreciated by those persons skilled in the art that low instantaneous AC (line) voltages are voltages close to 0V of the AC (line) voltage of, say, 240V. For example, low instantaneous AC voltages are about 0 to 10V. It will also be appreciated that low impedance is indicative of impedance values of around 10 KΩ to 50 KΩ and high impedance is indicative of several hundred KC) and above. The low impedance reduces the filtering effects and enables rectified dimmer voltage to fall close to zero-volt level for more precise control of conduction angle commencement. Also, it will be appreciated that, from a DC voltage perspective (e.g. rectified dimmer voltage), the current-sink circuit can be characterised as having an impedance which is proportional to applied voltage; hence impedance is lowest at rectified dimmer voltages of magnitude nearing the first threshold value It will also be appreciated by those persons skilled in the art that an ideal trailing edge phase control dimmer theoretically commences half-cycle conduction at the AC (line) voltage zero-crossing. Further, it will be appreciated that the current sink circuit (or current source circuit depending on action of the circuit) is a high voltage current sink circuit for use with high voltage AC voltage, such as 240V.

Preferably, the comparator circuit further includes a reference threshold hysteresis circuit to establish a second threshold value greater than the first threshold value. In this embodiment, the comparator circuit is further configured to initiate the switching circuit to commence one of the non-conduction periods when the rectified dimmer voltage crosses above the second threshold value. That is, the comparator circuit of the embodiment incorporates hysteresis to raise the zero-crossing detection threshold to the second threshold value for noise immunity purposes and to create a higher threshold suitable for a short-circuit cut-out function.

In an embodiment, the hysteresis of the comparator circuit achieves dual level zero-cross detection to enable an inherent short-circuit cut-out functionality. That is, the comparator circuit of the zero-crossing detection circuit is configured to initiate the switching circuit to commence one of the conduction periods when the rectified dimmer voltage crosses below the first threshold value and to initiate the switching circuit to prematurely terminate one of the conduction periods when the rectified dimmer voltage crosses above the second threshold value to provide short-circuit protection for the trailing edge phase control dimmer circuit. Details of this embodiment are incorporated herein by way of reference to the co-pending Australian provisional application entitled a phase control dimmer circuit with short-circuit protection.

In an embodiment, the dimmer circuit is a 2-wire trailing edge phase control dimmer circuit and the current sink circuit is a high-voltage constant-current sink. The use of the current-sink circuit is primarily to mitigate rectified dimmer voltage waveform distortion effects due to the adverse effects of filtering resulting from the parasitic capacitance and high-impedance resistive voltage division. The zero-crossing detection first (low) threshold value corresponds to a rectified dimmer voltage level subsequent to saturation of the current-sink transistor, where voltage across the series resistor (e.g. a current-sense resistor) proceeds to fall below a comparator OFF-state reference voltage indicative of the first threshold value.

In an embodiment, the current sink circuit further includes a control transistor connected to a base of the current-limiting transistor. The current-limiting transistor reaches saturation mode when the comparator circuit detects the rectified dimmer voltage crossing below the first threshold value. The comparator circuit then increases drive to the current-limiting transistor to disable current-limit operation and then maintains a resistive impedance of the current sink circuit (and when the rectified dimmer voltage is below the second threshold value).

In an embodiment, the comparator circuit includes a transistor pair to implement a comparator function of determining whether the rectified dimmer voltage crosses below the first threshold value, and output transistors to output a state of the zero-crossing detection circuit. Specifically, the comparator circuit outputs an ON-state when the rectified dimmer voltage crosses below the first threshold value and an OFF-state when the rectified dimmer voltage is initially above the first threshold value. Once in the ON-state, the comparator circuit maintains this condition until the rectified dimmer voltage crosses the second threshold value. The comparator circuit ON-state represents the beginning (and duration) of the conduction period and the OFF-state represents the beginning (and duration) of the non-conduction period when the rectified dimmer voltage is decreasing in magnitude (i.e. approaching the AC zero-crossing point).

In the embodiment, the comparator circuit includes voltage divider resistors with selected resistances to provide a comparator reference voltage, wherein the transistor pair compares the rectified dimmer voltage with the comparator reference voltage to determine whether the rectified dimmer voltage crosses below the first threshold value. That is, the comparator reference voltage is the abovementioned comparator OFF-state reference voltage. For example, the comparator OFF-state reference voltage is 0.7V and the zero-cross first (low) threshold value is 4.5V.

Also, the series resistor has a resistance selected so that when the current-limiting transistor reaches saturation mode an input voltage to a base of the transistor Q3 falls resulting in an output of the comparator circuit ceasing drive to the control transistor and the output transistor Q5, which increases drive to the current-limiting transistor. For example, the series resistor is a 10 KΩ resistor. That is, as a result of comparator circuit change to ON-state, the current-sink is simultaneously maintained in the saturation-state; hence, the series resistor determines transistor collector current. The current sink incorporates the relatively low series resistance to define the lowest impedance, then, in conjunction with a voltage-divider resistor, establishes the absolute zero-cross detection threshold. At zero-cross detection, the comparator output simultaneously provides additional bias to the current sink transistor to disable current-limit operation; hence, maintaining a resistive impedance at low rectified dimmer voltage levels. Thus, at dimmer half-cycle conduction period the current in the zero-cross detection circuit rises in proportion to the rectified dimmer voltage.

It will be appreciated by those persons skilled in the art that the components of the zero-crossing detection circuit are high-voltage components configured to withstand AC voltages of, say, 240V. For example, the above mentioned current sink circuit, current-limiting transistor, control transistor, and series resistor are high-voltage components.

In another embodiment, the comparator circuit includes further voltage divider resistors with selected resistances to provide a further comparator reference voltage. In this embodiment, a bias voltage of the control transistor from the base to the emitter of the control transistor is determined by the further comparator reference voltage, whereby a detected fall in the bias voltage indicates the rectified dimmer voltage crossing below the first threshold value.

BRIEF DESCRIPTION OF DRAWINGS

Embodiments of the invention will now be described, by way of example only, with reference to the accompanying drawings, in which:

FIG. 2 shows a zero-crossing detection circuit for a trailing edge phase control dimmer circuit according to an embodiment of the present invention; and FIG. 3 shows a zero-crossing detection circuit for a trailing edge phase control dimmer circuit according to another embodiment of the present invention.

DETAILED DESCRIPTION

Figure 1:
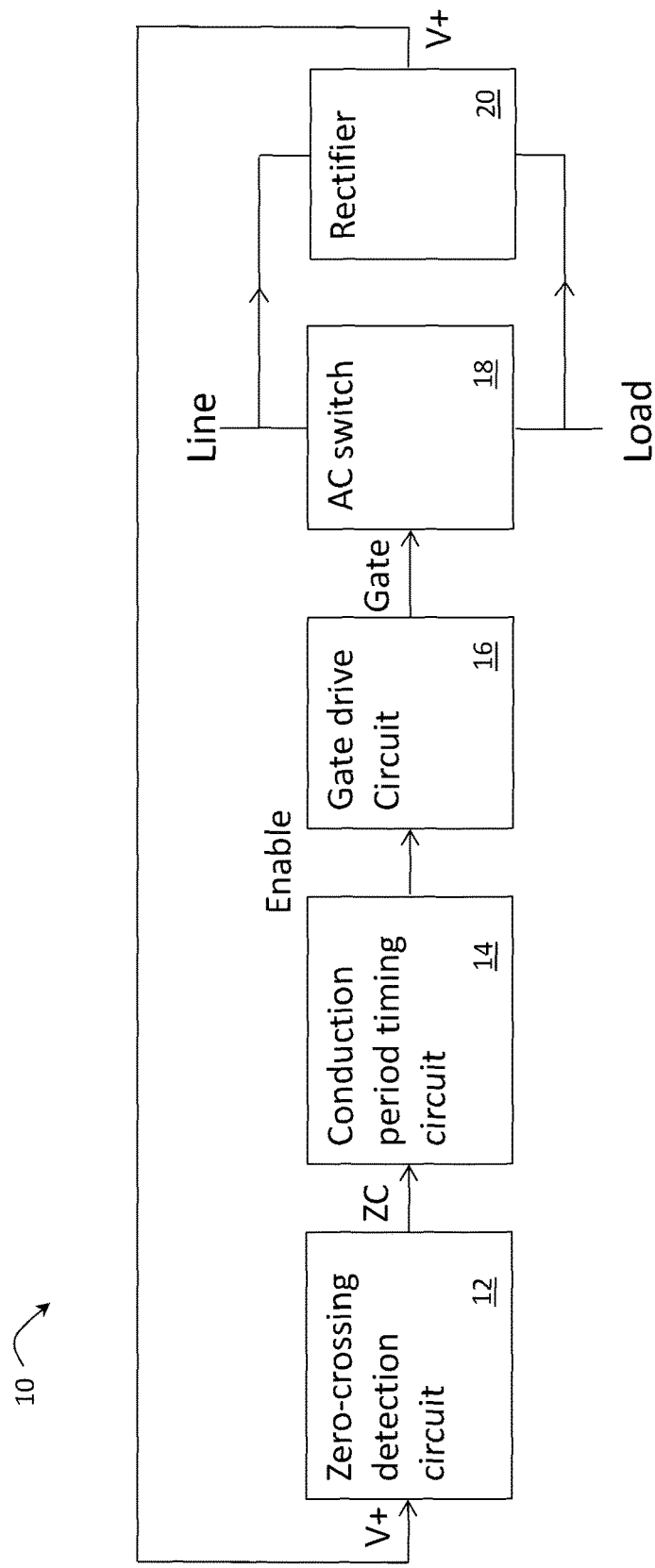
FIG. 1 is a block diagram showing some circuits of a trailing edge phase control dimmer circuit dimmer circuit, including a zero-crossing detection circuit according to an embodiment of the present invention.

FIG. 1 shows some of the circuits of a 2-wire trailing edge phase control dimmer circuit 10 according to an embodiment of the present invention that are configured to control power to a load. More specifically, FIG. 1 shows those circuits that are configured to operate in association with a zero-crossing detection circuit 12. It will be appreciated by those persons skilled in the art that many of the circuits of the dimmer circuit 10 do not affect operation of the zero-crossing detection circuit 12 and thus will not be discussed in detail herein.

The dimmer circuit 10 shown in the embodiment of FIG. 1 includes an AC switching circuit 18 for controlling delivery of AC power to the load by conducting power to the load in an ON state and not conducting power to the load in an OFF state, as described. It will be appreciated by those persons skilled in the art that the ON-state is a conduction period and the OFF-state is a non-conduction period, which are configured in duration to control dimming of, for example, a LED light where the load is an LED light driver. The AC switching circuit 18 is connected to a gate drive circuit 16 having a number of circuits for controlling turn-OFF and turn-ON of the AC switching circuit 18 at each half cycle of the AC to control switching of the ON and OFF states of the switching circuit 18. Further, the dimmer circuit 10 includes a rectifier 20 for rectifying the AC power in the non-conduction period to generate rectified dimmer voltage to be provided to the dimmer circuit 10.

As described, the zero-crossing detection circuit 12 is configured to detect zero crossings of the AC and to detect crossings of a first threshold value and, in the embodiment with hysteresis, a second threshold value of the rectified dimmer voltage. The zero-crossing detection circuit 12 is connected to a conduction period timing circuit 14 configured to determine the conduction periods and to alter the conduction periods based on the outputs of the zero-crossing detection circuit 12. Further, the conduction period timing circuit 14 is connected to the gate drive circuit 16 to turn-ON and turn-OFF the AC switching circuit 12 to provide the conduction and the non-conduction periods.

The zero-crossing of the AC occurs when the AC line voltage equals zero between the two polarities of the half cycles. As described, in practice, the crossing between conduction and non-conduction periods does not generally occur exactly at the AC line voltage zero-crossing. For example, the first threshold value is selected as a low threshold voltage of 4.5V and the second threshold value is a high threshold value of 6.5V.

Embodiments of the zero-crossing detection circuit 12 of the dimmer circuit 10 are shown in more detail in FIGS. 2 and 3. Specifically, FIG. 2 shows one embodiment of the zero-crossing detection circuit 12 and FIG. 3 shows an alternative embodiment of the zero-crossing detection circuit 12'.

In FIG. 2, the zero-crossing detection circuit 12 of the dimmer circuit 10 includes a current sink circuit 22, in the form of a high-voltage current sink (or source), including a high-voltage current-limiting transistor Q2 and a control transistor Q1. The zero-crossing detection circuit 12 also includes a comparator circuit 24, with hysteresis circuit components for providing the second threshold value, including transistor differential pair Q3 & Q4, and output transistors Q5, Q6 & Q7.

The comparator circuit 24 include voltage divider resistors R7 & R8 which provide a comparator voltage reference. In an example, the comparator voltage reference is set at about 0.7V, R7 is a 1 MΩ resistor and R8 is a 47 KΩ resistor. As discussed, the comparator circuit 24 compares a reference voltage with the rectified dimmer voltage to determine if the rectified dimmer voltage has crossed below the first threshold value. Under high rectified dimmer voltage conditions, this reference voltage—in conjunction with emitter resistor R3 of the current-limiting transistor Q2, due to action of the control transistor Q1—defines the constant-current quantity in the high-voltage current sink transistor Q2, at about 0.37 mA. In the example, R3 is a 1.8 KΩ resistor. Additionally, under these high rectified dimmer voltage conditions, the output transistor Q5 is driven to hold zero-crossing output ZC of the zero-crossing detection circuit 12 in a low-state or OFF-state. It will be appreciated by those persons skilled in the art that the output ZC of the zero-crossing detection circuit 12 is analogous to the output of the comparator circuit 24 of the zero-crossing detection circuit 12.

The above mentioned high-voltage current sink series resistor R2 has an initial effect at the zero-crossing first (low) threshold value—set in the embodiment at about 4.5V—where the current limiting transistor Q2 reaches saturation mode. For example, R2 is a 10 KΩ resistor. This permits comparator input voltage to fall, at transistor Q3 base, resulting in comparator circuit 24 output to simultaneously cease drive to the control transistor Q1 and the output transistor Q5. This action results in increased drive to the high-voltage current-sink transistor Q2; hence, maintaining and reinforcing the saturation state. Additionally, the change to high-state of ZC output increases the comparator reference voltage, to about 1.0V, which then determines the zero-crossing high threshold at about 6.5V. Due to such comparator circuit hysteresis, the rectified dimmer voltage must exceed the zero-crossing second (high) threshold value in order for ZC output to return to the low (OFF) state again.

In FIG. 3, the zero-crossing detection circuit 12' of the dimmer circuit 10 includes a current sink circuit 22' in the form of a further high-voltage current sink including a high-voltage current-limiting transistor Q1' and a further control transistor Q2'. The zero-crossing detection circuit 12' also includes a comparator circuit 24', also with a described hysteresis circuit. The zero-crossing detection circuit 12' of FIG. 3 simplifies the embodiment of the zero-crossing detection circuit 12 shown in FIG. 2 by eliminating the differential pair comparator circuit (Q3 & Q4). In the embodiment of FIG. 3, the comparator functionality is achieved using the further current sink control transistor Q2'. Resistor R3' provides base bias current for the further current-limiter transistor Q1', where—under high rectified dimmer voltage conditions—excess available drive current is conducted via further control transistor Q2' to further output transistor Q3' to hold ZC output signal in the low-state or OFF-state.

A bias voltage for the further control transistor Q2' of about 0.7V is established by further rail voltage divider resistors R5' & R6', in conjunction with the current-limiter transistor Q1' emitter resistor R2' to determine a nominal sink current at about 0.37 mA. In this example, the emitter resistor R2' is a 1.8 KΩ resistor. The zero-crossing first (low) threshold value again corresponds to the rectified dimmer voltage less being than about 4.5V, where the further current-limiter transistor Q1' enters saturation mode, which results in the fall of further control transistor Q2' emitter voltage and loss of drive to the further output transistor Q3', to cause ZC output signal to assume high-state. The ZC output buffer transistor Q4', with resistor R8', is used to provide reference voltage hysteresis, therefore create the zero-crossing ON-state second (high) threshold value which is used for noise immunity purposes in addition to the described short-circuit cut-out threshold function.

It will be understood that there may be other variations and modifications to the configurations describe here that are also within the scope of the present invention.

The invention claimed is:

1. A zero-crossing detection circuit for a trailing edge phase control dimmer circuit for controlling alternating current (AC) power to a load, wherein the trailing edge phase control dimmer circuit includes: a switching circuit for controlling delivery of AC power to the load by conducting power to the load in an ON state and not conducting power to the load in an OFF state, wherein the ON state is a conduction period and the OFF state is a non-conduction period; a switching control circuit for controlling turn-OFF and turn-ON of the switching circuit at each cycle of the AC to control switching of the ON and OFF states of the switching circuit; and a rectifier for rectifying the AC power in the non-conduction period to generate rectified dimmer voltage to be provided to the dimmer circuit, wherein the zero-crossing detection circuit includes:
a current sink circuit including a series resistor connected to a collector of a current-limiting transistor, an emitter resistor connected to an emitter of the current-limiting transistor, and a control transistor connected to a base of the current-limiting transistor,
wherein the current sink circuit has a low impedance at low instantaneous AC voltages to reduce effects of filtering by parasitic capacitance associated with the rectifier; and
a comparator circuit configured to detect zero crossings of a first threshold value of the rectified dimmer voltage across the series resistor and the emitter resistor, wherein the comparator circuit is further configured to initiate the switching circuit to operate and commence one of the conduction periods when the rectified dimmer voltage crosses below the first threshold value,
wherein the current-limiting transistor reaches saturation mode when the comparator circuit detects the rectified dimmer voltage crossing below the first threshold value.

2. A zero-crossing detection circuit as claimed in claim 1, wherein the comparator circuit increases drive to the current-limiting transistor to disable current-limit operation and then maintains a resistive impedance of the current sink circuit.

3. A zero-crossing detection circuit as claimed in claim 2, wherein the comparator circuit includes a transistor pair Q3 & Q4 to implement a comparator function of determining whether the rectified dimmer voltage crosses below the first threshold value, and output transistors Q5, Q6, & Q7 to output a state of the comparator circuit.

4. A zero-crossing detection circuit as claimed in claim 3, wherein the comparator circuit includes voltage divider resistors R7 & R8 with selected resistances to provide a comparator reference voltage, wherein the transistor pair Q3 & Q4 compares the rectified dimmer voltage with the comparator reference voltage to determine whether the rectified dimmer voltage crosses below the first threshold value.

5. A zero-crossing detection circuit as claimed in claim 4, wherein the series resistor has a resistance selected so that when the current-limiting transistor reaches saturation mode an input voltage to a base of the transistor Q3 falls resulting in an output of the comparator circuit ceasing drive to the control transistor and the output transistor Q5, which increases drive to the current-limiting transistor.

6. A zero-crossing detection circuit as claimed in claim 5, wherein the series resistor is a 10 KΩ resistor.

7. A zero-crossing detection circuit as claimed in claim 1, wherein the comparator circuit includes further voltage divider resistors R5' & R6' with selected resistances to provide a further comparator reference voltage.

8. A zero-crossing detection circuit as claimed in claim 7, wherein a bias voltage of the control transistor from the base to the emitter of the control transistor is determined by the further comparator reference voltage, whereby a detected fall in the bias voltage indicates the rectified dimmer voltage crossing below the first threshold value.

9. A zero-crossing detection circuit as claimed in claim 1, wherein the comparator circuit further includes a reference threshold hysteresis circuit to establish a second threshold value greater than the first threshold value.

10. A zero-crossing detection circuit as claimed in claim 9, wherein the comparator circuit is further configured to initiate the switching circuit to commence one of the non-conduction periods when the rectified dimmer voltage crosses above the second threshold value.

11. A zero-crossing detection circuit as claimed in claim 9, when appended to claim 2, wherein the comparator circuit maintains the resistive impedance when the rectified dimmer voltage is below the second threshold value.

* * * * *